(12) United States Patent
Kumar et al.

(10) Patent No.: US 9,299,646 B1
(45) Date of Patent: Mar. 29, 2016

(54) LEAD FRAME WITH POWER AND GROUND BARS

(71) Applicant: FREESCALE SEMICONDUCTOR, INC., Austin, TX (US)

(72) Inventors: Shailesh Kumar, Noida (IN); Piyush Kumar Mishra, Noida (IN)

(73) Assignee: FREESCALE SEMICONDUCTOR,INC., Austin, TX (US)

( * ) Notice: Subject to any disclaimer, the term of this patent is extended or adjusted under 35 U.S.C. 154(b) by 0 days.

(21) Appl. No.: 14/833,135

(22) Filed: Aug. 23, 2015

(51) Int. Cl.
*H01L 23/495* (2006.01)
*H01L 23/00* (2006.01)
*H01L 23/31* (2006.01)
*H01L 21/56* (2006.01)

(52) U.S. Cl.
CPC .......... *H01L 23/49541* (2013.01); *H01L 21/56* (2013.01); *H01L 23/3107* (2013.01); *H01L 23/49503* (2013.01); *H01L 24/49* (2013.01); *H01L 24/85* (2013.01); *H01L 2224/48247* (2013.01)

(58) Field of Classification Search
CPC ... H01L 23/055; H01L 23/057; H01L 23/495; H01L 23/49537; H01L 23/49541; H01L 23/49551; H01L 23/49528; H01L 23/49838
USPC .......................................... 257/676; 438/123
See application file for complete search history.

(56) References Cited

U.S. PATENT DOCUMENTS

| 5,767,575 | A | * | 6/1998 | Lan | H01L 23/13 257/701 |
|---|---|---|---|---|---|
| 7,960,818 | B1 | | 6/2011 | Davis et al. | |
| 8,188,579 | B1 | | 5/2012 | Kim et al. | |
| 8,575,742 | B1 | | 11/2013 | Kim et al. | |
| 8,933,547 | B1 | | 1/2015 | Yap et al. | |
| 9,000,570 | B2 | | 4/2015 | Chan et al. | |
| 2002/0118522 | A1 | * | 8/2002 | Ho | H01L 23/49827 361/762 |
| 2013/0082371 | A1 | * | 4/2013 | Chen | H01L 23/49541 257/676 |
| 2015/0137337 | A1 | * | 5/2015 | Hsieh | H01L 23/49541 257/676 |

* cited by examiner

*Primary Examiner* — Karen Kusumakar
(74) *Attorney, Agent, or Firm* — Charles E. Bergere

(57) ABSTRACT

A semiconductor device includes a die having first contact pads and a second contact pad. Signal leads, each having embedded portion and an exposed portion, are electrically connected to respective ones of the first contact pads. A power bar extends in an area between the signal lead embedded portions and the die and has a first side opposing the signal leads and a second side opposing the die. The power bar is electrically connected to the second contact pad. An electrically grounded ground bar extends at least partially in the area. The ground bar has a first portion between the signal lead embedded portions and the first side of the power bar, and a second portion between the second side of the power bar and the die.

11 Claims, 2 Drawing Sheets

LEAD FRAME WITH POWER AND GROUND BARS

BACKGROUND

The present invention is directed to semiconductor devices and, more particularly, to semiconductor packages adapted to reduce noise resulting from the power bar.

FIG. 1 shows a conventional design for a semiconductor device or package 10. A power bar 24 is placed between an edge of a semiconductor die 12 and a plurality of signal leads 22 extending outside of the package 10. Bond wires 28 electrically couple each of the signal leads 22 to respective contact pads 18 on the semiconductor die 12.

The bond wires 28 often carry extremely sensitive I/O signals to and from the semiconductor die 12, which are susceptible to noise coupling. Unfortunately, the traversal of the power bar 24 by the bond wires 28 creates this exact type of noise coupling, thereby creating unwanted interference. This limits design possibilities for the package 10.

It is therefore desirable to provide a semiconductor package that improves noise immunity for the signals carried by the electrical connections that must traverse the power bar.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

In the drawings.

DETAILED DESCRIPTION

In one embodiment, the present invention provides a semiconductor device including a semiconductor die having a plurality of first contact pads and at least one second contact pad disposed on or exposed through a surface thereof. A package casing encapsulates the semiconductor die. A plurality of signal leads are spaced apart from the semiconductor die and each has an embedded portion located within the package casing and an exposed portion located outside of the package casing. Each of the signal leads is electrically connected to one of the first contact pads. A power bar extends at least partially in an area between the embedded portions of the plurality of signal leads and the semiconductor die and has a first side opposing the signal leads and a second side opposing the semiconductor die. The power bar is electrically connected to the at least one second contact pad. A ground bar that is electrically grounded extends at least partially in the area. The ground bar has a first portion disposed between the embedded portions of the plurality of signal leads and the first side of the power bar, and a second portion disposed between the second side of the power bar and the semiconductor die.

In another embodiment, the present invention provides a method of assembling a semiconductor device that includes providing a semiconductor die having a plurality of first contact pads and at least one second contact pad disposed on or exposed through a surface thereof, providing a plurality of signal leads spaced apart from the semiconductor die, providing a power bar extending at least partially in an area between the plurality of signal leads and the semiconductor die and having a first side opposing the signal leads and a second side opposing the semiconductor die, and providing a ground bar that extends at least partially in the area. The ground bar has a first portion disposed between the plurality of signal leads and the first side of the power bar, and a second portion disposed between the second side of the power bar and the semiconductor die. The method further includes electrically connecting each of the signal leads to a respective one of the first contact pads, electrically connecting the power bar to the at least one second contact pad, and encapsulating the semiconductor die, the power bar, the ground bar, and a portion of each of the signal leads in a packaging material.

Figure 1:
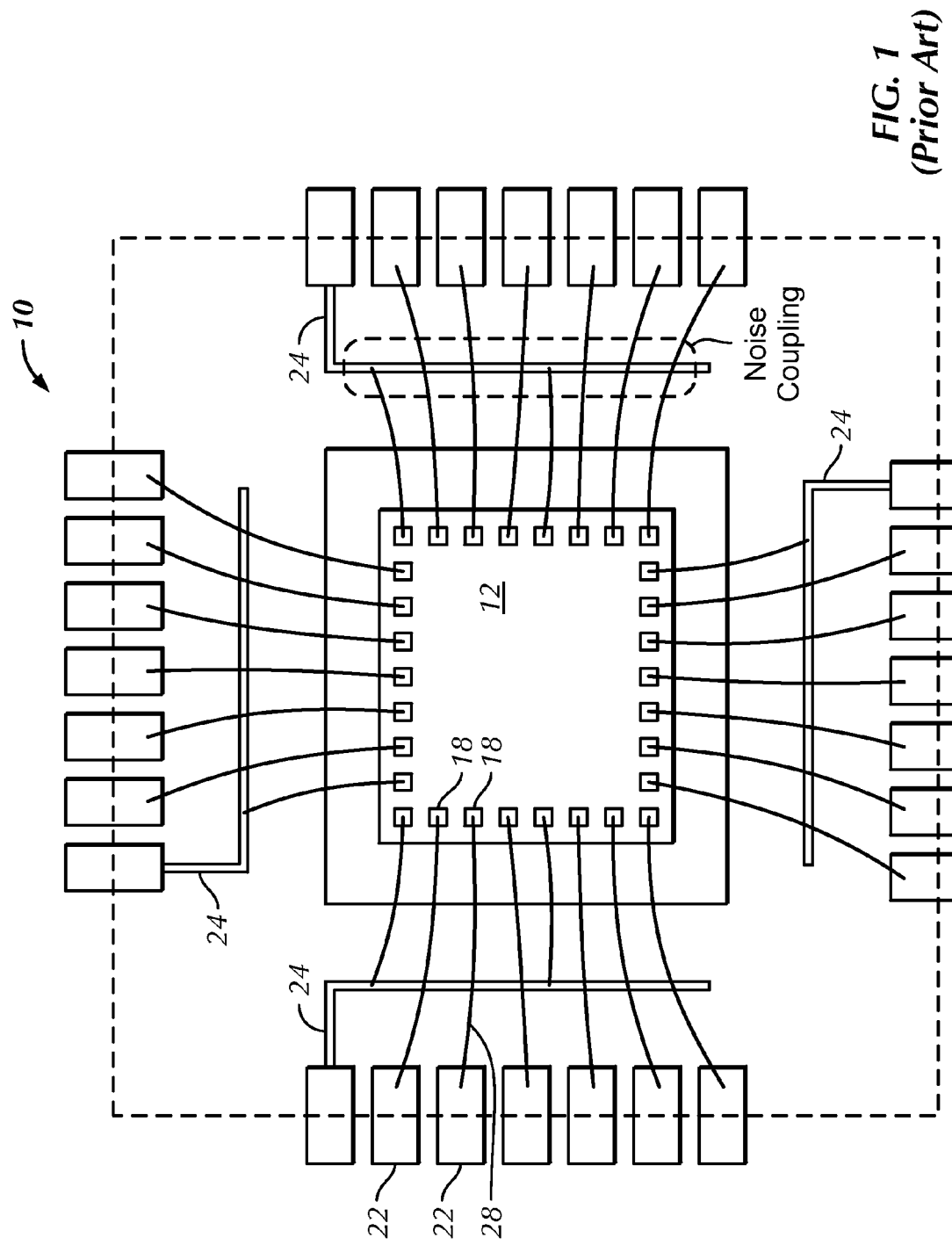
FIG. 1 is a partial top plan view of a conventional semiconductor package.
Figure 2:
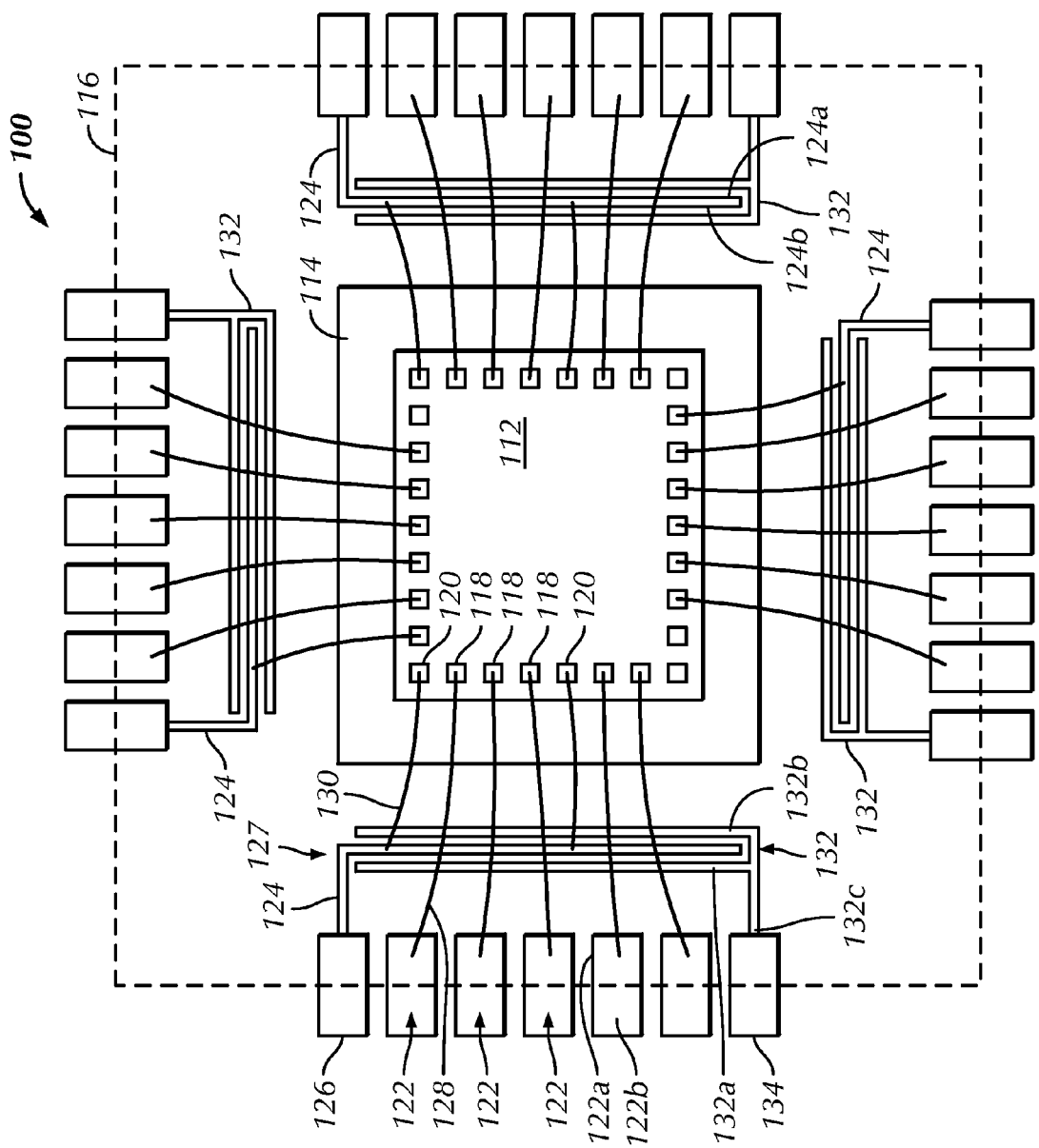
FIG. 2 is a partial top plan view of a semiconductor package in accordance with a preferred embodiment of the present invention.

Referring now to the drawings, wherein the same reference numerals are used to designate the same components throughout the several figures, there is shown in FIG. 2 an embodiment of a semiconductor device 100 in accordance with the present invention. The semiconductor device 100 includes a semiconductor die 112 that is typically in the form of an integrated circuit (IC) or the like. The semiconductor die 112 may be made from any semiconductor material or combinations of materials, such as gallium arsenide, silicon germanium, silicon-on-insulator (SOI), silicon, monocrystalline silicon, the like, and combinations of the above. Further, the die 112 may implement various types of circuits, such as a processor, a controller, a System on a Chip, or the like, and the circuit may have one or more different power domains. The semiconductor die 112 may further be mounted on a die pad 114, which, as is conventionally known, may provide structural support and/or electrical connections for the semiconductor die 112.

The semiconductor device 100 further includes a package casing 116 (shown in phantom in FIG. 2) that encapsulates the semiconductor die 112. The package casing 116 is preferably formed from a mold compound, such as a ceramic material, a polymeric material, or the like, as is known in the art.

The semiconductor die 112 preferably includes a plurality of first contact pads 118 and at least one, and preferably a plurality, of second contact pads 120. The first and second contacts pads 118, 120 are preferably made from a conductive material, such as gold or the like, and may be disposed on a surface of the semiconductor die 112, or are embedded within the semiconductor die 112 and partially exposed at the surface, as is conventionally known. The first contact pads 118 are preferably reserved for receiving I/O signals or the like. The second contact pads 120 are preferably reserved for receiving power to the semiconductor die 112, as will be described in further detail below.

The semiconductor device 100 further preferably includes a plurality of signal leads 122 to which the semiconductor die 112 is connected via the first contact pads 118. Each of the signal leads 122 is preferably made from a conductive material, such as copper (Cu), aluminum (Al), or the like. The plurality of signal leads 122 may also be coated, alloyed, or pre-plated with a metal layer or layers such as silver (Ag), gold (Au), nickel (Ni), palladium (Pd), tin (Sn), or the like. However, other materials may be used for the signal leads 122. The number and shapes of the signal leads 122 may be varied as necessary depending on the end use configurations and other such factors. In particular, each signal lead 122 preferably has an embedded portion 122a located within the package casing 116 and an exposed portion 122b extending from one of the main side walls of the package casing 116. As shown in FIG. 2, the signal leads 122 preferably surround a periphery of the semiconductor die 112 in a rectangular shape, although other configurations may be used as well, depending on size requirements, the shape of the semiconductor die 112, the shape of the package casing 116, and other like factors.

A power bar 124 is provided that extends at least partially in an area 127 between the embedded ends 122b of the signal leads 122 and the semiconductor die 112. In particular, at least a portion of the power bar 124 is preferably formed to extend longitudinally in a direction parallel to an adjacent side of the semiconductor die 112. In FIG. 2, four power bars 124 are provided, each extending at least partially along the nearest adjacent side of the semiconductor die 112. In accordance with this configuration, each power bar 124 preferably includes a first side 124a located opposite to the adjacent signal leads 122 and a second side 124b located opposite to the semiconductor die 112. The power bars 124 are preferably made from the same or similar material as the signal leads 122 (e.g., copper, aluminum, or the like).

The power bar 124 is preferably coupled at one end thereof to a power bar lead 126 that, similar to the signal leads 122, is partially embedded within the package casing 116. An opposite end of the power bar 124 is preferably free. For example, in FIG. 2, the power bar 124 has an "L" shape extending from the respective power bar lead 126.

A first set of bond wires 128 is preferably used to electrically couple the signal leads 122 to respective ones of the first contact pads 118 of the semiconductor die 112. The first bond wires 128 can be formed using a conventional wire bonding process. At least one, and preferably a plurality, of second bond wires 130 is preferably used to electrically couple the power bars 124 to one or more of the second contact pads 120 of the semiconductor die 112. The first and second bond wires 128, 130 are preferably in the form of gold or copper wires, although other materials may be used. While wires are the preferred structure, other electrical connection methods are also contemplated.

A ground bar 132 is further provided that is electrically grounded and extends at least partially in the area 127 between the signal leads 122 and the semiconductor die 112. The ground bar 132 preferably nearly surrounds at least one of the power bars 124 to provide noise shielding. In FIG. 2, a plurality of ground bars 132 are shown, one for each power bar 124. The ground bars 132 are preferably made from the same or similar material as the signal leads 122 (e.g., copper, aluminum, or the like).

In one embodiment, each ground bar 132 includes a first portion 132a disposed between the adjacent embedded portions 122b of the signal leads 122 and the first side 124a of the adjacent power bar 124, and a second portion 132b disposed between the second side 124b of the adjacent power bar 124 and the semiconductor die 112. In FIG. 2, the first and second portions 132a, 132b extend generally longitudinally along most of the length of the corresponding power bar 124.

The first and second portions 132a, 132b of the ground bar 132 in one embodiment are coupled together by a third portion 132c running perpendicularly with respect to the first and second portions 132a, 132b. In the embodiment shown in FIG. 2, the ground bar 132 is grounded by connecting the third portion 132c to a ground lead 134 that, like the signal leads 122 and power bar leads 126, is partially embedded in the package casing 116. However, the ground bar 132 may be connected to the ground lead 134 in other ways while keeping with the invention.

A method of assembling the semiconductor device 100 shown in FIG. 2 will now be described. First, the semiconductor die 112 is provided and prepared to include the first and second contact pads 118, 120, which can be done either by attaching the first and second contact pads 118, 120 using welding, soldering, deposition, plating, or other like techniques, or by forming a partially exposed material using etching or polishing techniques or by filling vias or other through-holes to create an exposed end.

The plurality of signal leads 122, and also preferably the power bar leads 126 and the ground leads 134, are provided spaced-apart from the semiconductor die 112. This is accomplished typically through provision of a lead frame (not shown) containing all of the necessary leads. The power bars 124 and ground bars 132 may be formed sequentially or simultaneously, and can be formed through deposition or plating techniques, or other conventional methods. Alternatively, the power bars 124 and ground bars 132 can be formed as part of the lead frame with the leads 122, 126, 134.

The signal leads 122 are electrically connected to respective first contact pads 118, preferably using a wire bonding process, as described above. The power bars 124 are similarly connected to respective second contact pads 120. The semiconductor die 112, the power bar 124, the ground bar 132, and portions of the signal leads 122, power bar leads 126, and ground leads 134 are then encapsulated in the packaging material using conventional molding techniques.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:
1. A semiconductor device, comprising:
a semiconductor die having a plurality of first contact pads and at least one second contact pad disposed on or exposed through a surface thereof;
a package casing that covers the semiconductor die;
a plurality of signal leads spaced apart from the semiconductor die and each having an embedded portion located within the package casing and an exposed portion located outside of the package casing, each of the signal leads being electrically connected to a respective one of the first contact pads;
a power bar extending at least partially in an area between the embedded portions of the plurality of signal leads and the semiconductor die and having a first side opposing the signal leads and a second side opposing the semiconductor die, the power bar being electrically connected to the at least one second contact pad; and
a ground bar that is electrically grounded and extends at least partially in said area, the ground bar having a first portion disposed between the embedded portions of the plurality of signal leads and the first side of the power bar, and a second portion disposed between the second side of the power bar and the semiconductor die.

2. The semiconductor device of claim 1, wherein the ground bar includes a third portion that extends perpendicularly with respect to the first and second portions and is adjacent a free end of the power bar.

3. The semiconductor device of claim 2, wherein the third portion of the ground bar is coupled to a ground lead having an embedded portion located within the package casing and an exposed portion located outside of the package casing.

4. The semiconductor device of claim 1, wherein the power bar is coupled at one end to a power bar lead having an embedded portion located within the package casing and an exposed portion located outside of the package casing.

5. The semiconductor device of claim 1, wherein the semiconductor device comprises a plurality of second contact pads and a plurality of second bond wires, each of which electrically connects the power bar to a respective one of the second contact pads.

6. The semiconductor device of claim 1, further comprising:
a plurality of first bond wires, each electrically connecting an embedded portion of one of the signal leads to one of the first contact pads; and
at least one second bond wire electrically connecting the power bar to the at least one second contact pad.

7. A method of assembling a semiconductor device, the method comprising:
providing a semiconductor die having a plurality of first contact pads and at least one second contact pad disposed on or exposed through a surface thereof;
providing a plurality of signal leads spaced apart from the semiconductor die;
providing a power bar that extends at least partially in an area between the plurality of signal leads and the semiconductor die and having a first side opposing the signal leads and a second side opposing the semiconductor die;
providing a ground bar that extends at least partially in said area, the ground bar having a first portion disposed between the plurality of signal leads and the first side of the power bar, and a second portion disposed between the second side of the power bar and the semiconductor die;
electrically connecting each of the signal leads to a respective one of the first contact pads;
electrically connecting the power bar to the at least one second contact pad; and
encapsulating the semiconductor die, the power bar, the ground bar, and a portion of each of the signal leads in a packaging material.

8. The method of claim 7, wherein providing the ground bar includes forming a third portion of the ground bar that extends perpendicularly with respect to the first and second portions and is adjacent a free end of the power bar.

9. The method of claim 8, further comprising:
coupling the third portion of the ground bar to a ground lead; and
encapsulating a portion of the ground lead in the packaging material.

10. The method of claim 7, further comprising:
coupling the power bar at one end to a power bar lead; and
encapsulating a portion of the power bar lead in the packaging material.

11. The method of claim 7, wherein the step of electrically connecting the signal leads to the first contact pads is performed by wire bonding, and the step of electrically connecting the power bar to that at least one second contact pad is performed by wire bonding.

* * * * *